US012754267B2

(12) United States Patent
Wang et al.

(10) Patent No.: US 12,754,267 B2
(45) Date of Patent: Oct. 6, 2026

(54) SYSTEM AND METHOD FOR GENERATING WATER-FAT SEPARATED IMAGE

(71) Applicant: GE Precision Healthcare LLC, Waukesha, WI (US)

(72) Inventors: Xinzeng Wang, Houston, TX (US); Kang Wang, Sussex, WI (US)

(73) Assignee: GE Precision Healthcare LLC, Waukesha, WI (US)

( * ) Notice: Subject to any disclaimer, the term of this patent is extended or adjusted under 35 U.S.C. 154(b) by 164 days.

(21) Appl. No.: 18/907,792

(22) Filed: Oct. 7, 2024

(65) Prior Publication Data

US 2026/0098924 A1 Apr. 9, 2026

(51) Int. Cl.
*G01R 33/48* (2006.01)
*G01R 33/56* (2006.01)

(52) U.S. Cl.
CPC ..... *G01R 33/4828* (2013.01); *G01R 33/5608* (2013.01)

(58) Field of Classification Search
CPC ............ G01R 33/4828; G01R 33/5608; G01R 33/56518
See application file for complete search history.

(56) References Cited

U.S. PATENT DOCUMENTS 5,225,781 A 7/1993 Glover et al.
7,924,003 B2 4/2011 Yu et al.
8,030,923 B2 10/2011 Yu et al.
8,373,415 B2 2/2013 Reeder et al.
8,527,031 B2 9/2013 Yu et al.
8,957,681 B2 2/2015 Hernando et al.
10,776,925 B2 9/2020 Zhang
2018/0299526 A1* 10/2018 Eggers .................. G01R 33/58

FOREIGN PATENT DOCUMENTS

CN 115479556 A * 12/2022 ......... G01B 11/2504

OTHER PUBLICATIONS

Machine translation of CN115479556 (Year: 2022).*
Ma et al., "Linear Phase-Error Correction for Improved Water and Fat Separation in Dual-Echo Dixon Techniques", Magnetic Resonance in Medicine 60:, pp. 1250-1255, 2008.

* cited by examiner

*Primary Examiner* — G.M. A Hyder
(74) *Attorney, Agent, or Firm* — Andrus Intellectual Property Law, LLP

(57) ABSTRACT

A method for generating an image of a subject with a magnetic resonance imaging (MRI) system includes receiving MR image data acquired with the MRI system, wherein the MR image data comprises first gradient echo data and second gradient echo data and determining a linear phase error estimate. The linear phase error estimate may be based on all of the MR image data or a subvolume thereof, and may include calculating a pixel phase error for each of a plurality of pixels within the MR image data and determining a mean of the pixel phase error. Corrected MR image data is generated based on the linear phase error estimate, and then a water image and/or a fat image based on the corrected MR image data.

20 Claims, 8 Drawing Sheets

SYSTEM AND METHOD FOR GENERATING WATER-FAT SEPARATED IMAGE

BACKGROUND

The present disclosure generally relates to systems and methods for magnetic resonance imaging ("MRI"). More particularly, the disclosure relates to systems and methods for performing calculations for fat-water separation for MRI imaging.

MRI is often used to obtain internal physiological information about a patient, including for brain imaging, spine imaging, cardiac imaging and imaging other sections or tissues within a patient's body (anywhere on the patient).

MRI uses the nuclear magnetic resonance ("NMR") phenomenon to produce images. When a substance such as human tissue is subjected to a uniform magnetic field, such as the so-called main magnetic field (polarizing field $B_0$) generated by an MRI system, the individual magnetic moments of the nuclei in the tissue attempt to align with this $B_0$ field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", Mz, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients, sometimes referred to as readout gradients, vary according to the particular localization method being used. The resulting set of received signals are digitized and processed to reconstruct the image using reconstruction techniques.

Many MRI systems are configured to generate water-fat separated images, which are MRI images in which the contributions to the MR signal from fat tissues and water, commonly referred to as the "fat signal component" and the "water signal component" of the MR signal, have been partially and/or fully separated from each other. As will be appreciated, "water images", which, as used herein, refers to a type of water-fat separated image where the fat signal component has been partially and/or fully removed, often provide a better diagnostic depiction/view of an object than traditional MRI images, which typically depict contributions to the MR signal from both water and fat tissues. Conversely, "fat images", as used herein, refer to a type of water-fat separated image in which the water signal component has been partially and/or fully removed.

Methods for water-fat separation for imaging spin species such as fat and water are well known, such as the Dixon method (and variations thereof) and the "IDEAL" method. The IDEAL method employs pulse sequences to acquire multiple images at different echo times ("TE") and an iterative least squares approach to estimate the separate water and fat signal components. One embodiment of the IDEAL method is described in U.S. Pat. No. 7,924,003. Other methods for fat suppression and/or for generating water-fat separated images are known in the relevant art, such as those described in U.S. Pat. Nos. 8,030,923; 8,373,415; 8,527,031; and 10,776,925.

Such approaches for generating water-fat separated images often involve solving for the fat component and/or the water component via a system of equations that models the contributions of fat tissues and water to the MR signal based on one or more underlying field maps. It is often difficult, however, to resolve phase ambiguity in and/or to accurately estimate these underlying field maps. As used herein, the term "phase" refers to the sign of the water signal component and/or the fat signal component. For example, "in-phase" refers to a scenario where the sign of the water signal component and the sign of the fat signal component are the same, e.g., the fat signal component adds/increases to the water signal component. Conversely, the terms "out-of-phase" and "opposed-phase" refer to a scenario where the sign of the water signal component and the sign of the fat signal component are different/opposed, e.g., the fat signal component subtracts from the water signal component.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

In one aspect of the disclosure, a method for generating an image of a subject with a magnetic resonance imaging (MRI) system includes receiving MR image data acquired with the MRI system, wherein the MR image data comprises first gradient echo data and second gradient echo data and determining a linear phase error estimate. Corrected MR image data is generated based on the linear phase error estimate, and then a water image and/or a fat image based on the corrected MR image data.

In one embodiment, linear phase error estimate is based on a subvolume of the image data, wherein the subvolume is less than the field of view (FOV) volume of the image data in at least one of the x-dimension, the y-dimension, and the z-dimension.

In one embodiment, the method includes identifying a subvolume of the MR image data and then determining the linear phase error estimate based on the subvolume of the image data.

In another embodiment, the subvolume is determined based on signal intensities of the pixels in the image data.

In another embodiment, the method includes calculating a pixel phase error for each of a plurality of pixels within the MR image data and determining the linear phase error estimate based on a mean of the pixel phase error.

In another embodiment, determining the mean of the pixel phase error includes generating a histogram of the pixel phase error and fitting the histogram to a Gaussian function.

In another embodiment, determining the mean of the pixel phase error further includes weighing the histogram of the pixel phase error based on a signal intensity for each of the plurality of pixels prior to fitting the histogram.

In another embodiment, the method further includes weighting the pixel phase error for each pixel based on the signal intensity of that pixel to generate a weighted pixel phase error for each of the plurality of pixels, wherein the mean of the pixel phase error is determined based on the weighted pixel phase error.

In another embodiment, wherein the plurality of pixels includes all pixels in the MR image data.

In another embodiment, the MR image data has a field of view (FOV) volume, wherein the plurality of pixels are within a subvolume of the FOV volume, wherein the subvolume is smaller than the FOV in at least one of an x-dimension, a y-dimension, and a z-dimension. Optionally, the subvolume is smaller than the FOV in at least the x-dimension and the y-dimension.

In another embodiment, the subvolume for determining the linear phase error estimate is a predetermined fixed volume around a center point of the FOV.

In another embodiment, the method further includes, prior to calculating the linear phase error estimate, identifying the subvolume of the FOV volume based on a signal intensity of one or more pixels within the MR image data. Optionally, the one or more pixels within the MR image data are within an edge region of the FOV volume.

In one embodiment, the MR image data is obtained using bipolar readout gradients.

In another embodiment, the MR image data is obtained using unipolar readout gradients.

In another aspect of the disclosure, a magnetic resonance imaging (MRI) system includes a magnet system configured to generate a polarizing magnetic field about at least a portion of a subject arranged in the MRI system, a plurality of gradient coils configured to apply gradient pulses to the polarizing magnetic field, a radio frequency (RF) system configured to apply an RF field to the subject and to acquire magnetic resonance (MR) image data therefrom, a processing device and memory storage device. The memory storage device includes instructions executable by the processing device to control the MRI system to acquire MR image data from the subject generated by the gradient pulses, wherein the MR image data comprises first gradient echo data and second gradient echo data, calculate a pixel phase error for each of a plurality of pixels within the MR image data, determine a linear phase error estimate based on the pixel phase errors for the plurality of pixels, wherein determining the linear phase error estimate includes determining a mean of the pixel phase error, and adjust the second gradient echo data based on the linear phase error estimate to generate corrected MR image data. A water image and/or a fat image are then generated based on the correct MR image data.

In one embodiment, the controller is configured to determine the mean of the pixel phase error by generating a histogram of the pixel phase error and then fitting the histogram to a gaussian function.

In another embodiment, the controller is further configured to determine the mean of the pixel phase error by weighing the histogram of the pixel phase error based on a signal intensity for each of the plurality of pixels prior to fitting the histogram.

In another embodiment, the controller is further configured to weight the pixel phase error for each pixel based on the signal intensity of that pixel to generate a weighted pixel phase error for each of the plurality of pixels, wherein the mean of the pixel phase error is determined based on the weighted pixel phase error.

In one embodiment, the plurality of pixels includes all pixels in the MR image data.

In another embodiment, the MR image data has a field of view (FOV) volume, wherein the plurality of pixels are within a subvolume of the FOV volume.

In another embodiment, the subvolume is smaller than the FOV in at least one of an x-dimension, a y-dimension, and a z-dimension.

In another embodiment, the subvolume is a predetermined volume around a center point of the FOV.

In another embodiment, prior to calculating the pixel phase error for each of the plurality of pixels, identifying the subvolume of the FOV volume based on a signal intensity of one or more pixels within an edge region of the FOV volume.

In one embodiment, the MR image data is obtained using bipolar readout gradients. In another embodiment, the MR image data is obtained using unipolar readout gradients. Thus, the disclosed method of learn phase error correction may be utilized to correct obtained using unipolar or bipolar readout gradients.

In another aspect of the present disclosure, a magnetic resonance imaging (MRI) system includes a magnet system configured to generate a polarizing magnetic field about at least a portion of a subject arranged in the MRI system, a plurality of gradient coils configured to apply gradient pulses to the polarizing magnetic field, a radio frequency (RF) system configured to apply an RF field to the subject and to acquire magnetic resonance (MR) image data therefrom, a processing device and memory storage device. The memory storage device includes instructions executable by the processing device to control the MRI system to acquire MR image data from the subject, wherein the MR image data comprises first gradient echo data and second gradient echo data. A subvolume of the MR image data is identified and extracted, which is less than all of the MR image data. A linear phase error is then determined based on the subvolume of MR image data. The second gradient echo data is then adjusted based on the linear phase error estimate to generate corrected MR image data. A water image and/or a fat image are then generated based on the correct MR image data.

Various other features, objects, and advantages of the invention will be made apparent from the following description taken together with the drawings.

BRIEF DESCRIPTION OF THE DRAWINGS

The present disclosure is described with reference to the following Figures.

DETAILED DESCRIPTION

In the present description, certain terms have been used for brevity, clarity and understanding. No unnecessary limitations are to be inferred therefrom beyond the requirement of the prior art because such terms are used for descriptive purposes only and are intended to be broadly construed.

As used herein, unless otherwise limited or defined, discussion of particular directions is provided by example only, with regard to particular embodiments or relevant illustrations. For example, discussion of "top," "bottom," "front," "rear," "left," "right," "horizontal," "vertical," and "longitudinal" features and/or relative motion, e.g., movement "up" and "down," is generally intended as a description only of the orientation of such features relative to a reference frame of a particular example or illustration. Correspondingly, for example, a "top" feature may sometimes be disposed below a "bottom" feature (and so on), in some arrangements or embodiments. Additionally or alternatively, embodiments may be arranged in a different orientation such that "top" and "bottom" features are arranged horizontally relative to each other, for example in a "left-to-right" orientation.

The use herein of the terms "including," "comprising," or "having," and variations thereof, is meant to encompass the elements listed thereafter and equivalents thereof, as well as additional elements. Embodiments recited as "including," "comprising," or "having" certain elements are also contemplated as "consisting essentially of" and "consisting of" those certain elements.

The inventors have developed the disclosed improved system and method for generating a water-fat separated images, and more particularly to solve long-standing problems with estimating linear phase error for water-fat separation and fat quantification in MRI imaging, which heretofore has been error-prone and too sensitive to magnetic field inhomogeneities.

The linear phase error must be estimated and compensated for in image reconstruction. Phase errors in MR image data can arise from many different sources, such as due to eddy currents in the gradient coils or other conducting structures in the system, such as the RF receive coils, or other factors. Inaccurate estimation of the linear phase error leads to introduction of artifacts in the resulting water and fat images. In some instances, misestimation of linear phase error can cause global water-fat separation failure, as shown in FIGS. 1A and 1B.

Figure 1A:
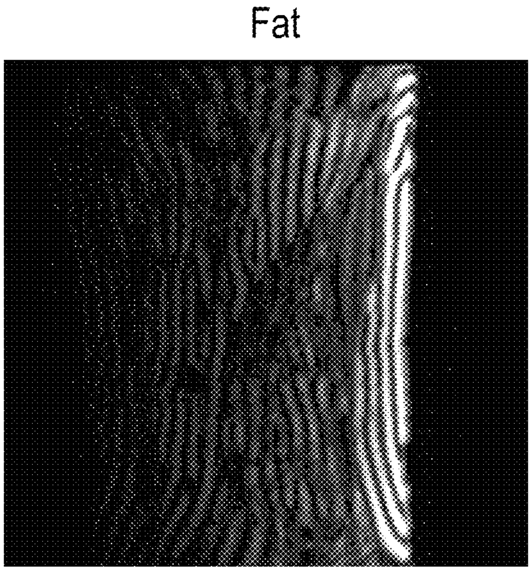
FIG. 1A illustrates an exemplary fat image generated from MR image data, wherein the image contains artifact due to overestimation of the linear phase error.
Figure 1B:
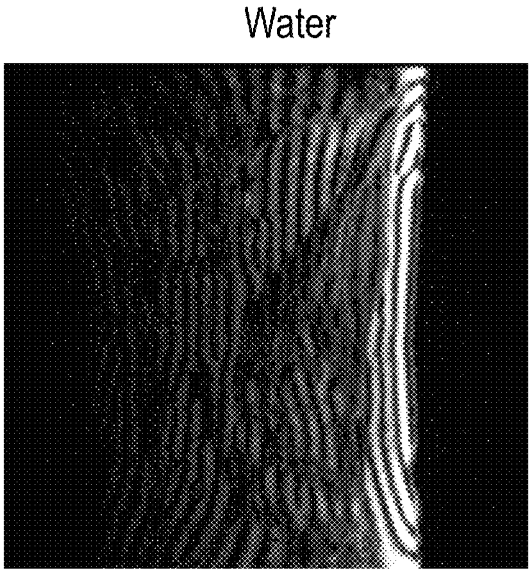
FIG. 1B illustrates an exemplary water image generated from MR image data, wherein the image contains artifact due to overestimation of the linear phase error.

FIG. 1A illustrates a fat image where global water-fat separation failure occurred, and FIG. 1B illustrates a water image where global water-fat separation failure occurred. The inventors have recognized that the water-fat separation failure illustrated here is due to overestimation of the linear phase error resulting from hyperintense pixels caused by gradient non-linearity and high receiver coil sensitivity. Existing methods of linear phase error estimation, such as the modified Ahn-Cho method, are heavily reliant on signal intensity. For example, the modified Ahn-Cho method weights the phase gradient by the 4th power of the signal intensity. Thus, erroneously high signal intensities due to gradient non-linearities significantly impact the resulting linear phase error estimation.

In view of the foregoing problems recognized by the inventors and the long-standing challenges with reliable generation of water-fat separated images, the inventors have developed the disclosed methods and system for linear phase error estimation that are less impacted by erroneously hyperintense pixels, thereby reducing the chance of water-fat separation failure and providing reliable water-fat separated images. In some embodiments, the disclosed methods and systems are configured to calculate the linear phase error estimate by determining a mean of the pixel phase error for each of a plurality of pixels within the MR image data. The mean may be determined by generating a histogram of the pixel phase error and fitting the histogram to identify a peak, such as by fitting the histogram values to a Gaussian function.

In some embodiments, a weighting function may be utilized prior to determining the mean of pixel phase error, where the sum of the pixel signal intensity values is further used to generate the histogram prior to fitting the histogram values to the Gaussian function. The optional weighting can minimize the impact of the background signals, which may be particularly useful for MR images where only a small portion of the image contains MR signals from the tissue of interest and the rest is background. In some embodiments, the plurality of pixels used for the linear phase error estimate may be all of the pixels in the MR image data, but in other embodiments may be a subset of the pixels in the image data, such as the pixels in a subvolume as described below.

The inventors have further recognized that gradient nonlinearities that lead to overestimation of the linear phase error tend to be concentrated at the edge of the image field of view (FOV), where nonlinearities from multiple locations are sometimes compressed into a few pixels at the edge of the image creating an erroneously high signal intensity at those pixels. Thus, the inventors have developed the disclosed method whereby the linear phase error estimate is generated based on a subvolume of the field of view (FOV) wherein the image data at one or more edge regions of the FOV is removed, thereby eliminating most or all of the source of hyperintense pixels. In various embodiments discussed further herein, the subvolume may be a predetermined volume around a center point of the FOV of the image data, or may be identified based on the signal intensities of the pixels in the image data, such as based on the signal intensities in one or more edge regions of the FOV. The subvolume may be smaller in one or all of the x-dimension (i.e., the frequency encoding direction), the y-dimension (i.e., the phase encoding direction), or the z-dimension (the slice encoding direction). The disclosed subvolume identification for determining the linear error estimate may be used in combination with the mean pixel error methods described herein, or may be used in combination with existing linear error estimation algorithms, such as the Ahn-Cho method.

Figure 1C:
FIG. 1C illustrates an exemplary fat image generated from the MR image data using a method for estimating the linear phase error according to the present disclosure.
Figure 1D:
FIG. 1D illustrates an exemplary water image generated from the MR image data using a method for estimating the linear phase error according to the present disclosure.

FIGS. 1D and 1C show a water image and a fat image, respectively, generated using the disclosed methods for estimating the linear phase error, including using a subvolume that is smaller than the FOV volume of the image data in the x-dimension and the y-dimension and calculating the linear phase error estimate as a mean of the pixel error of the pixels in the subvolume. The images in FIGS. 1D and 1C are generated using the same MR image data used to generate the images shown in FIGS. 1A and 1B and using the same water-fat separation algorithms. Thus, FIGS. 1D and 1C demonstrate the effectiveness of the disclosed methods of linear phase error estimation for improving the quality and accuracy of water-fat separated images.

Figure 2:
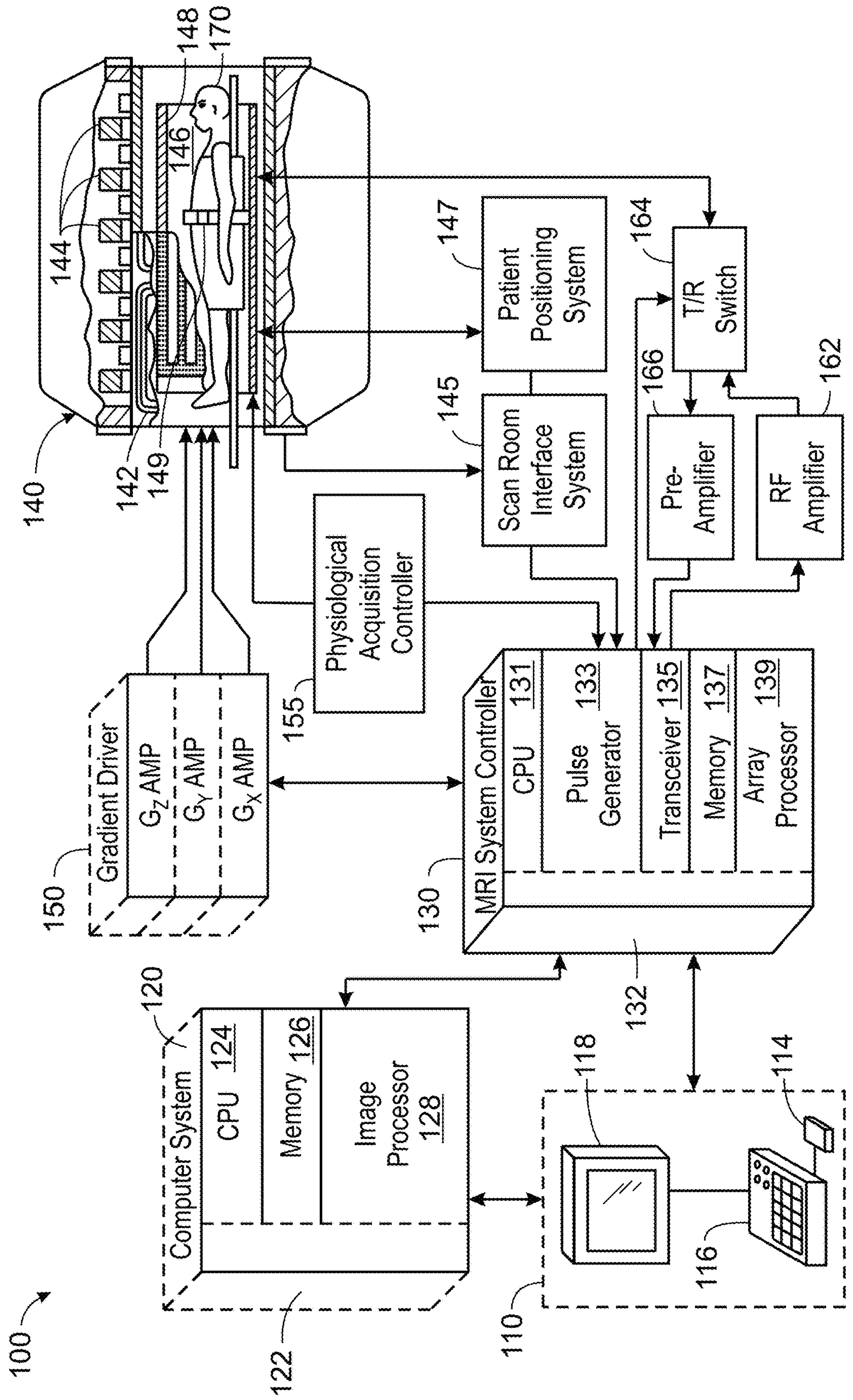
FIG. 2 is a schematic diagram of an MRI system in accordance with an exemplary embodiment.

Referring to FIG. 2, a schematic diagram of an exemplary MRI system 100 is shown in accordance with an embodiment. The operation of MRI system 100 is controlled from an operator workstation 110 that includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The components of the computer system 120 include a central processing unit (CPU) 124, a memory 126, which may include a frame buffer for storing image data, and an image processor 128. In an alternative embodiment, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The components of the MRI system controller 130 include a CPU 131, a pulse generator 133, which is coupled to and communicates with the operator workstation 110, a transceiver 135, a memory 137, and an array processor 139. In an alternative embodiment, the pulse generator 133 may be integrated into a resonance assembly 140 of the MRI system 100. The MRI system controller 130 is coupled to and receives commands from the operator workstation 110 to indicate the MRI scan sequence to be performed during a MRI scan. The MRI system controller 130 is also coupled to and communicates with a gradient driver system 150, which is coupled to a gradient coil assembly 142 to produce magnetic field gradients during an MRI scan.

The gradient driver system 150 may be configured to control the gradient coils to apply bipolar gradient pulses, wherein the gradient is turned on in a first direction (e.g., the "positive direction") for an amount of time and then turned in the opposite direction (e.g., the "negative direction") for an equivalent amount of time, where the positive bipolar gradient pulse has the positive lobe first and a negative bipolar gradient pulse has the negative lobe first. The bipolar gradients are used, for example, in water/fat MRI imaging to acquire in-phase and out-phase images at different echo times. The bipolar gradients are readout gradients to acquire images at different echo times. Alternatively, unipolar readout gradient pulses may be generated, and the disclosed linear phase correction methods may be utilized to phase correct the unipolar MR data. The pulsed gradient fields perform various functions integral to the imaging process. Some of these functions are slice selection, frequency encoding and phase encoding. These functions may be applied along the X-axis (frequently referred to as the frequency encoding direction), Y-axis (frequently referred to as the phase encoding direction), and Z-axis (frequently referred to as the slice selection encoding direction) of the original coordinate system or along other axes determined by combinations of pulsed currents applied to the individual field coils. The phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

The pulse generator 133 may also receive data from a physiological acquisition controller 155 that receives signals from a plurality of different sensors connected to an object or patient 170 undergoing the MRI scan, including electrocardiography (ECG) signals from electrodes attached to the patient 170. And finally, the pulse generator 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a table 171. The able 171 is controllable to move the patient in and out of the core 146 and to move the patient to a desired position within the core 146 for an MRI scan.

The MRI system controller 130 provides gradient waveforms to the gradient driver system 150, which includes, among others, $G_x$, $G_y$ and $G_z$ amplifiers. Each $G_x$, $G_y$ and $G_z$ gradient amplifier excites a corresponding gradient coil in the gradient coil assembly 142 to produce magnetic field gradients used for spatially encoding MR signals during an MRI scan. The gradient coil assembly 142 is included within the resonance assembly 140, which also includes a superconducting magnet having superconducting coils 144, which in operation, provides a homogenous longitudinal magnetic field $B_0$ throughout a core 146, or open cylindrical imaging volume, that is enclosed by the resonance assembly 140. The resonance assembly 140 also includes a RF body coil 148 which in operation, provides a transverse magnetic field $B_1$ that is generally perpendicular to $B_0$ throughout the core 146. The resonance assembly 140 may also include RF surface coils 149 used for imaging different anatomies of a patient undergoing a MRI scan. The RF body coil 148 and RF surface coils 149 may be configured to operate in a transmit and receive mode, transmit mode, or receive mode.

An object or patient 170 undergoing a MRI scan may be positioned within the core 146 of the resonance assembly 140. The transceiver 135 in the MRI system controller 130 produces RF excitation pulses that are amplified by an RF amplifier 162 and provided to the RF body coil 148 and RF surface coils 149 through a transmit/receive switch (T/R switch) 164.

As mentioned above, RF body coil 148 and RF surface coils 149 may be used to transmit RF excitation pulses and/or to receive resulting MR signals from a patient undergoing a MRI scan. The resulting MR signals emitted by excited nuclei in the patient undergoing an MRI scan may be sensed and received by the RF body coil 148 or RF surface coils 149 and sent back through the T/R switch 164 to a pre-amplifier 166. The amplified MR signals are demodulated, filtered and digitized in the receiver section of the transceiver 135. The T/R switch 164 is controlled by a signal from the pulse generator 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

The resulting MR signals sensed and received by the RF body coil 148 are digitized by the transceiver 135 and transferred to the memory 137 in the MRI system controller 130.

The MR scan is complete when an array of raw k-space data, corresponding to the received MR signals, has been acquired and stored temporarily in the memory 137 until the data is subsequently transformed to create images. This raw k-space data is rearranged into separate k-space data arrays for each image to be reconstructed, and each of these separate k-space data arrays is input to the array processor 139, which operates to Fourier transform the data into arrays of image data.

The array processor 139 uses a known transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems.

The computer system 120, which including the image pressor 128, may be configured to process the MR image data to generate one or more water-fat separated images. Alternatively, the water-fat separation may be determined elsewhere, such as in a separate computing system configured for post-processing MR image data after the imaging has been completed. As described above, the linear phase error must be determined and corrected for as part of the water-fat separation determination, and thus as a precursor to generating water-fat separated images. Thus, the computing system configured to process the image data to generate the water-fat separated images may also be configured to calculate the linear phase error estimate as a preliminary step. Alternatively, the linear phase error may be determined and stored at the time of imaging, such as by the computer system 120, and the water-fact separation algorithms may be performed as a post-processing step by a different computing system.

Traditional methods of linear phase error estimation rely on signal intensity to weight the pixels, such as the modified Ahn-Cho method which weights the phase gradient by the fourth power of the signal intensity. The inventors have recognized that such reliance on signal intensity, in the modified Ahn-Cho method and other existing methods for determining linear phase error, are suboptimal and not robust because erroneously high signal intensity tend to throw off the error estimate and lead to poor performance in fat-water separation. Accordingly, the inventors have developed improved methods and systems generating fat-water separated MR images whereby the linear error estimation is less reliant on signal intensity and whereby the importance of erroneously high signal intensity pixels is demoted in the calculation, or such pixels are eliminated entirely from the calculation of the linear phase error. Thereby, the disclosed methods and systems reduce the chance of water-fat separation failure and reliably provide water-fat separated images.

Figure 3:
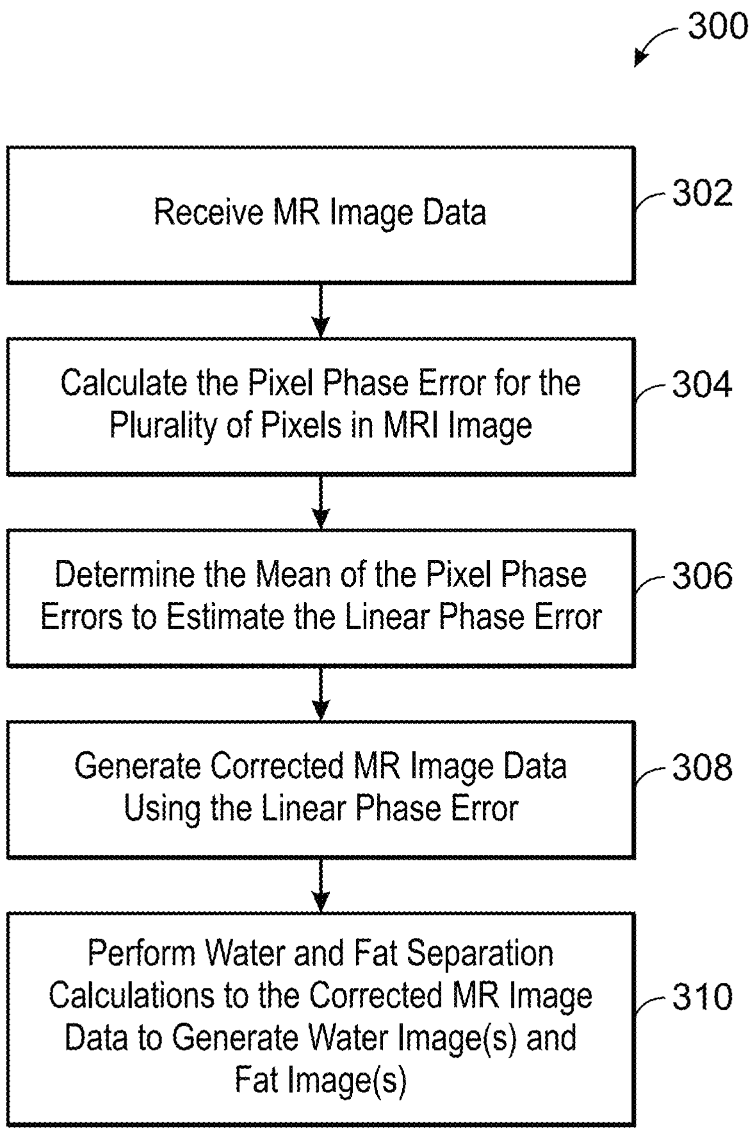
FIG. 3 exemplifies one method for estimating linear phase error and performing water-fat image separation according to the present disclosure.

FIG. 3 is a flow chart exemplifying a method for generating a water-fat image with an MR system utilizing one embodiment of the linear phase error estimation. The exemplary method 300 includes receiving MR image data at step 302, wherein the MR image data is generated by an MRI system 100, such as using a large gradient ramp to achieve the desired in-phase and out-of-phase echo times with bipolar readout. Namely, for dual-echo imaging methods in which two echoes with water and fat in-phase and out-of-phase are consecutively acquired with two readout gradients of alternating polarity, where a large gradient ramp may be utilized for the gradient polarity switch immediately before the second echo readout.

The pixel phase error is calculated at step 304 for each of a plurality of pixels in the MR data, which may be for all of the pixels in the MR data or for a subset thereof. The MR data has a field of view (FOV) volume that includes a number of pixels in the x-y plane (e.g., along the frequency and phase encoding directions) for each of a number of slices in the z direction (e.g., along the slice encoding direction). The pixel phase error may be calculated for all of the pixels in the x-y plane for all slices in the z direction, or it may be calculated for a subset of those pixels (such as for a subvolume as described in more detail below).

The pixel phase error may be calculated for each pixel using the following equation:

$$\varepsilon(x, y, z) = -\frac{1}{2}\arg\left[S_1'^2(x, y, z)\cdot S_1'^{2*}(x, y, z)\right]$$

wherein ε(x, y, z) id the pixel phase error in each of the x, y, and z directions.

$$S_1'^2(x, y, z)$$

is the square of the signal at location (x, y, z), and $$S_1'^{2*}(x, y, z)$$

is the complex conjugate of the square of the signal at location (x+1, y, z).

Figure 4:
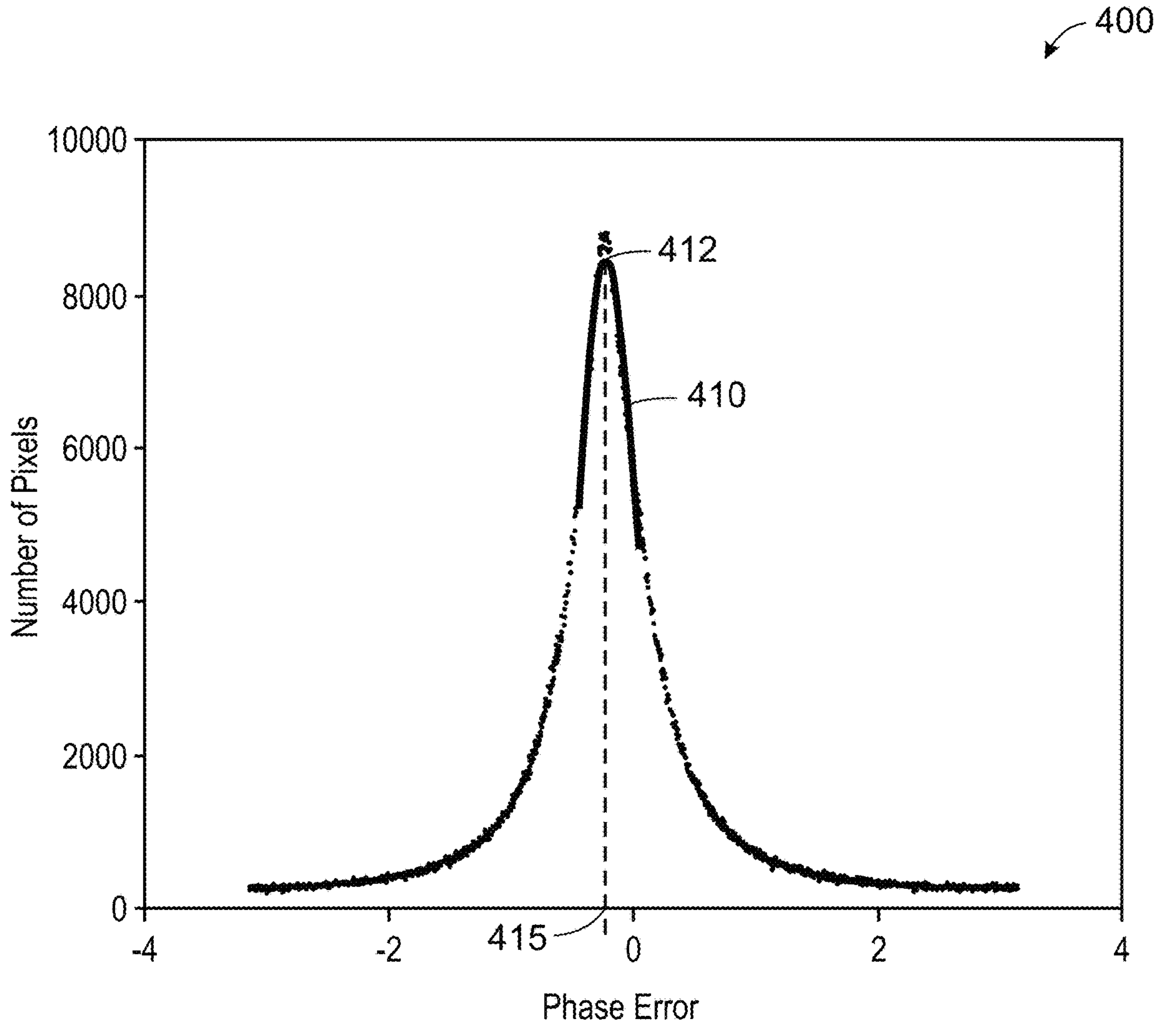
FIG. 4 illustrates a histogram generated for estimating the linear phase error according to an embodiment of the present disclosure.

A mean of the pixel phase error is then determined at step 306. In one embodiment, the mean of pixel phase error is determined by generating a histogram of the pixel phase error and then fitting the data, such as to a Gaussian function. The mean is then determined based on the fitted histogram, which represents the linear phase error estimation. FIG. 4 represents one such embodiment, where exemplary pixel phase error values are plotted as a histogram 400, showing the number of pixels with given phase error values. The values in the histogram are then fitted using a fitting function to determine a fitted line 410 representing at least the peak portion of the histogram data. In one embodiment, a linear regression algorithm is performed on the center values of the histogram, such as a predetermined range around the maximum point (e.g., +/−1 radian), and the result of the linear regression is then fitted to a Gaussian function. The peak 412 of the fitted line 410 is then determined. The phase error value 415 associated with the peak 412 is the linear phase error estimate. In this example, the phase value 415 determined as the linear phase error estimation is −0.102 radian.

Once the linear phase error is determined at step 306, it is used to phase correct the MR image data at step 308. Namely, the linear phase error is removed from the image data corresponding to the second echo. The water-fat separation calculations are then performed with the corrected MR image data, such as according to one of the known separation techniques referenced above to produce an image of the subject depicting a desired amount of signal contribution from water and a desired amount of signal contribution from fat using the separated signal contributions. A water image and/or a fat image are generated accordingly, as represented at step 310.

Figure 5:
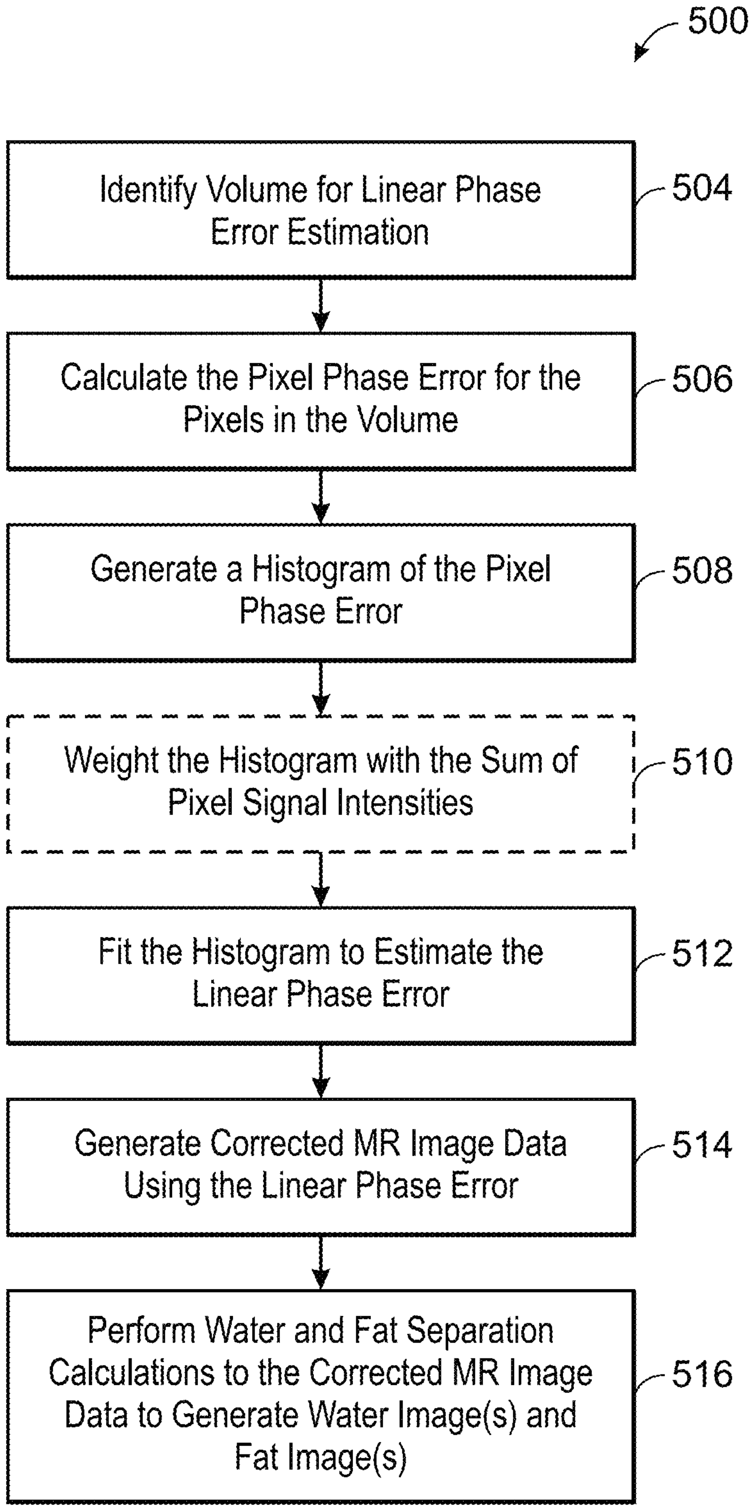
FIG. 5 exemplifies another method for estimating linear phase error and performing water-fat image separation according to the present disclosure.

FIG. 5 is a flow chart exemplifying a method for generating a water-fat image with an MR system utilizing another embodiment of the linear phase error estimation. Here, the exemplary method 500 includes, after receiving the MR image data to be processed, first identifying a volume of the received MR image data to be utilized for determining the linear phase error estimate. The volume to be used for the linear phase error estimate is determined at step 504, which may be based on a predetermined fixed volume or may be a volume determination based on the image data, such as based on the signal intensities across the FOV volume. Where a fixed volume is to be utilized for the error estimate calculation, it may be a subvolume of the FOV volume that is smaller in at least one of the x-dimension, the y-dimension, or the z-dimension. The predetermined fixed subvolume may be defined in various ways, such as according to a percentage of the FOV volume in each of the x, y, and z directions or according to a predetermined measurement (e.g., in centimeters or other length unit in each direction). In other embodiments, the subvolume may be a determined subvolume size as described below. In either the fixed or determined subvolume embodiments, the subvolume may be positioned or identified around a center point of the image (i.e., the center point in each of the x, y, and z directions). Alternatively, the position of the subvolume may be determined as part of the volume identification, and thus positioned off center within the FOV volume, such as to avoid including erroneously hyperintense pixel values. In still other embodiments, the volume used for the linear phase error estimation may be the entire FOV volume, and thus all pixels in the image data may be utilized.

The pixel phase error is then calculated at step 506 for each of the pixels in the volume, e.g., all pixels in the subvolume, used for the linear phase error estimation. The pixel phase error may be calculated according to the equations shown and described above. The mean of the pixel phase error is then determined. In some embodiments, the mean may be determined using a histogram. A histogram of the pixel phase error values is generated at step 508, which shows the number of pixels with a given pixel phase error.

Figure 6:
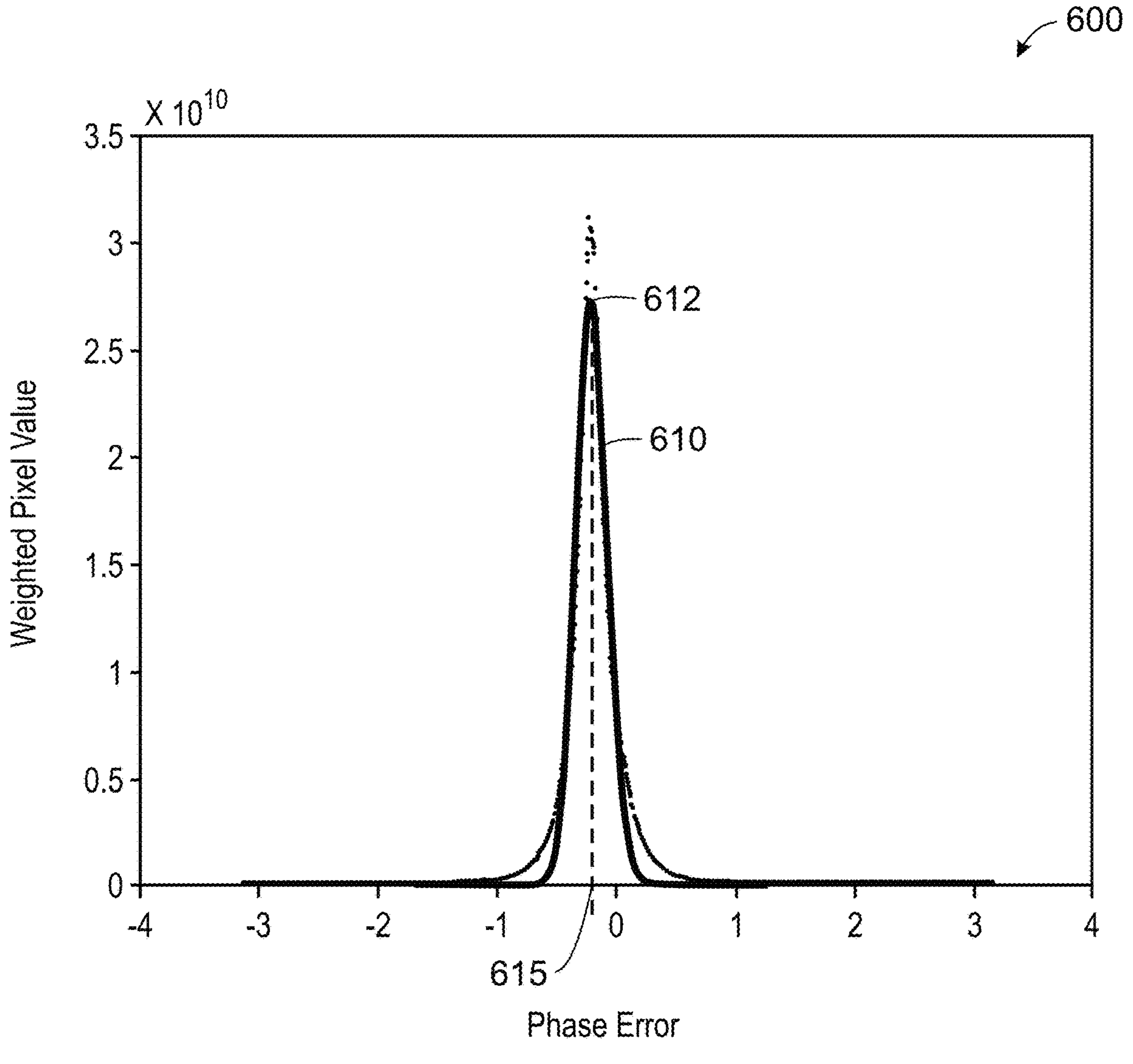
FIG. 6. illustrates a histogram generated for estimating the linear phase error according to the embodiment shown in FIG. 5.

In some embodiments, the pixel phase error values used for the mean determination may be weighted according to the signal intensities of that pixel. For example, the histogram may be weighted, as shown in step 510, based on the sum of the pixel signal intensities. FIG. 6 exemplifies such an embodiment, where the histogram 600 is weighted with the sum of the signal intensities of the pixels with the same phase error $$(S'_{1,bin}),$$

and thus is calculated by $$\sum S'_{1,bin}.$$

As can be seen by comparing the histogram in FIG. 6 with that in FIG. 4, weighting the histogram can accentuate the peak value and thus yield a better peak determination. Weighting the pixel phase errors according to the signal intensities of the corresponding pixels can minimize the impact of background signals in cases where only a small portion of the image contains MR signals from tissue, where the signal intensities of the pixels associated with the tissue will be higher on average than the signal intensities of the background tissue. In some embodiments, the weighting step may be combined with the subvolume determination step so that pixels with erroneously high signal intensities (such as at the edges of the image) are removed before calculating the pixel phase error.

The mean of the pixel phase error (weighted or unweighted) is then determined to calculate the linear phase error estimate. In the embodiment illustrated in FIGS. 5-6, the mean is determined by fitting the values in the histogram 600 using a fitting function to determine a fitted line 610 representing at least the peak portion of the histogram data. In one embodiment, a linear regression algorithm is performed on the center values of the histogram, such as a predetermined range around the maximum point (e.g., +/−1 radian), and the result of the linear regression is then fitted to a Gaussian function. The peak 612 of the fitted line 610 is then determined. The phase error value 615 associated with the peak 612 is the linear phase error estimate. In this example, the phase value 615 determined based on the weighted histogram as the linear phase error estimation is −0.105 radian, which is close to by slightly larger than the error estimate calculated based on the unweighted histogram shown in FIG. 4.

Returning to FIG. 5, once the linear phase error is determined at step 512, it is used to phase correct the MR image data at step 514. Namely, the linear phase error is removed from the image data corresponding to the second echo. The water-fat separation calculations are then performed with the corrected MR image data, such as according to one of the known separation techniques referenced above. A water image and/or a fat image are then generated accordingly, as represented at step 516.

Figure 7:
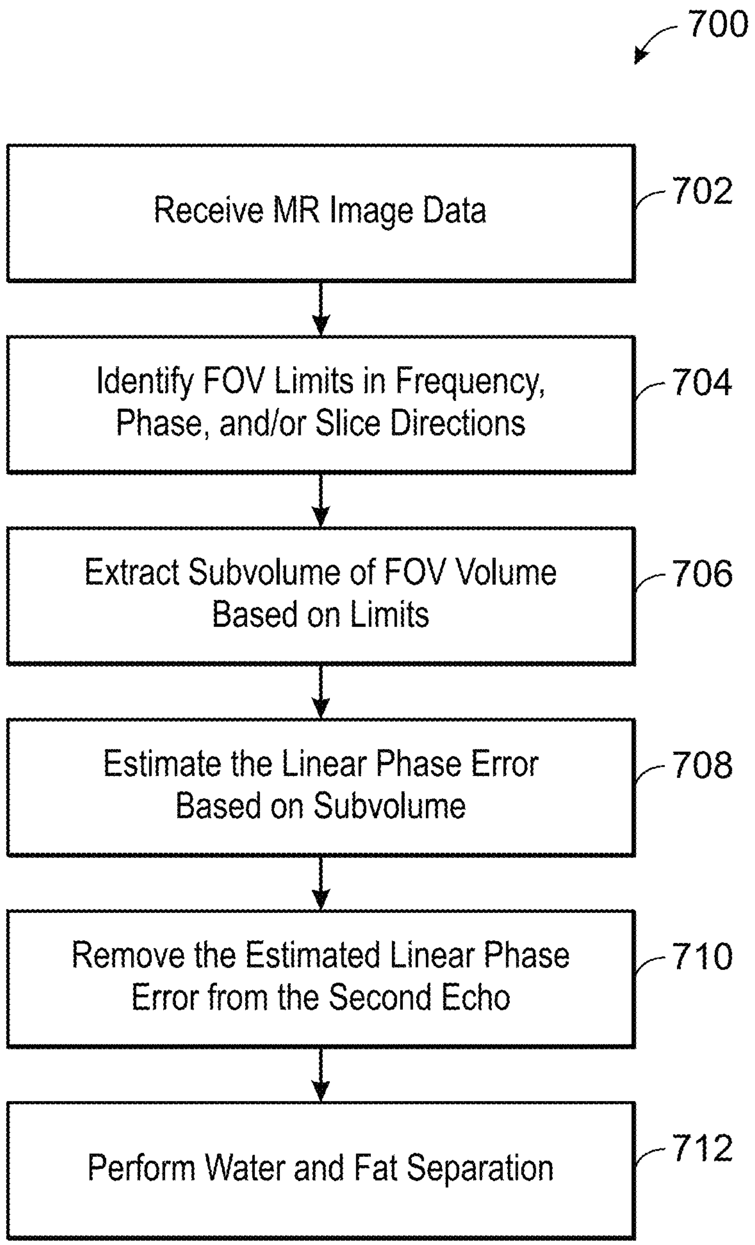
FIG. 7 exemplifies another method for estimating linear phase error and performing water-fat image separation according to the present disclosure.

FIG. 7 illustrates another embodiment of a method of calculating the linear phase error estimate for use in water-fat separation calculation. The image data received at step 702 has an FOV volume having x-dimension, y-dimension, and z-dimension. Steps are executed at step 704 to identify a subvolume, wherein limits for the FOV are determined for the x-direction (frequency encoding direction), y-direction (phase encoding direction), and/or z-direction (slice encoding direction). The subvolume identified may be a predetermined fixed subvolume size (e.g., one or more subvolume dimensions that are less than the x, y, and/or z dimensions of the FOV volume) cut from the FOV volume, or the subvolume size may be determined based on the image data and thus customized for that image being processed to eliminate erroneous pixels while otherwise maximizing the amount of image data utilized for the linear error estimation. The subvolume may be defined in various ways, such as according to a percentage of the FOV volume in each of the x, y, and z directions or according to a predetermined measurement (e.g., in centimeters or other length unit in each direction).

Figure 8:
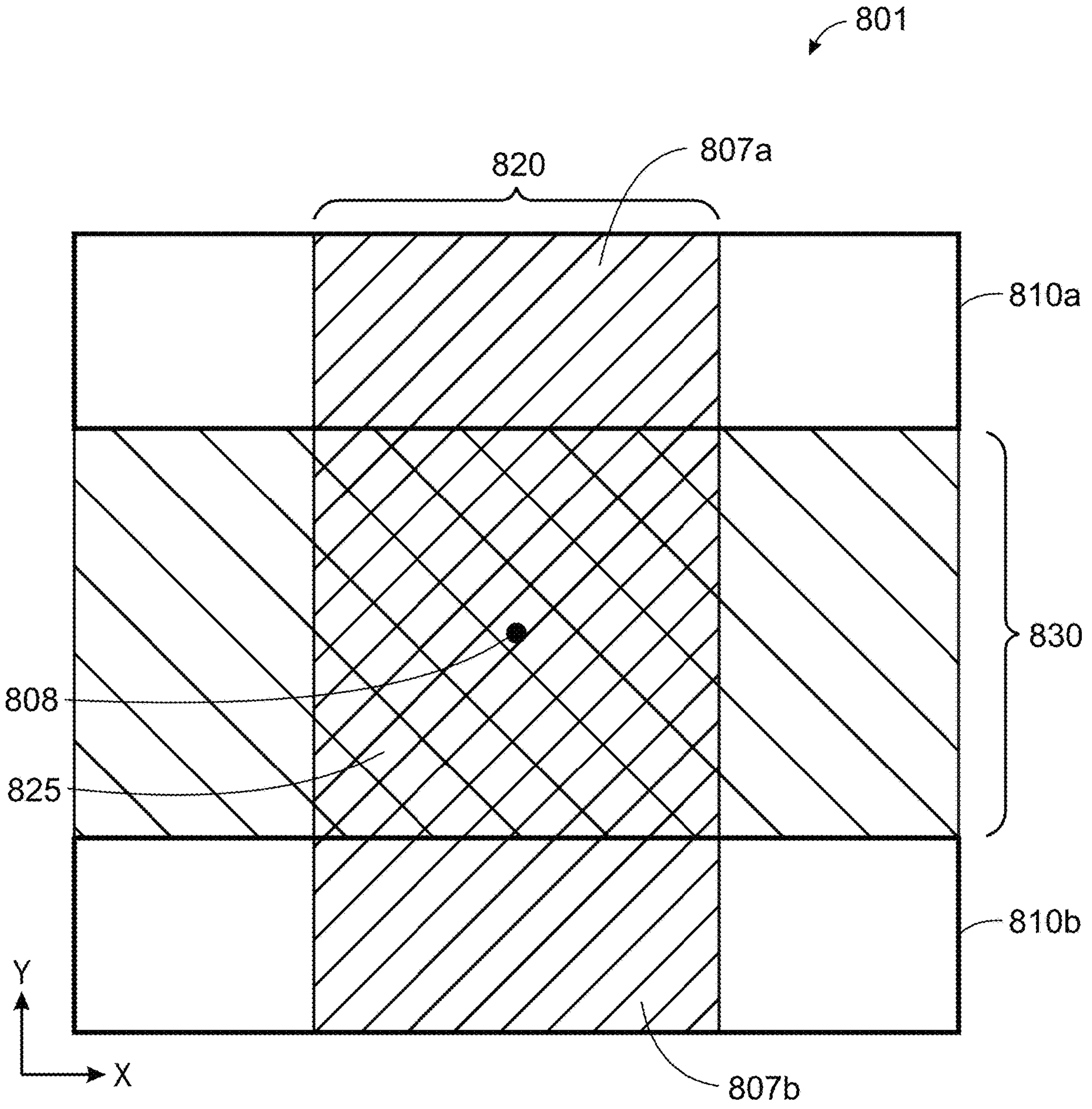
FIG. 8 represents an exemplary FOV of MRI image data and identification of a subvolume within the FOV for determining the linear phase error estimate according to exemplary embodiments of the present disclosure.

FIG. 8 illustrates one embodiment of a subvolume determination for exemplary image data 801. The image data 801 here is shown as an image with an x-dimension and a y-dimension, which represents one slice in a plurality of slices spaced along the 2-dimension. The image data 801 includes groups of pixels 807*a* and 807*b* with erroneously high signal strength. As described above, pixels with errantly high signal intensities tend to be concentrated along the edges of the FOV volume, which may be along the edge in the x-dimension, the y-dimension, and/or the z-dimension. Thus, the image processing algorithm and system may be configured to assess the image data in pixels in the edge regions, exemplified here as 810*a* and 810*b*, to define the subvolume. In the depicted example, the errant groups of pixels 807*a* and 807*b* are concentrated in the edge regions 810*a* and 810*b* of the FOV. This first group of pixels 807*a* is in the edge region 810*a* and the second group of pixels 807*b* is in the edge region 810*b*. In this example, the edge regions 810*a* and 810*b* are defined along the y-axis, as regions on the upper and lower sections of the image along the x-dimension. Alternatively or additionally, edge regions may be defined with respect to the x-axis as regions in the lower and upper values in the x-dimension, and/or edge regions may be defined with respect to the z-axis as slices in the lower and upper values in the z-dimension.

The image processing algorithm and system may be configured to assess the image data in pixels in one or more such edge regions to define the subvolume, such as to define FOV limits in one or more of the x-dimension, the y-dimension, and the 2-dimension. For example, the FOV limits may be defined to eliminate pixels in the edge region(s) that have a signal strength that is greater than a threshold signal strength, i.e., such that pixels 807*a* and 807*b* with erroneously high signal strengths are excluded.

A subvolume of image data is then extracted from the FOV volume based on the FOV limits. In the example shown in FIG. 8, the subvolume 825 of image data that gets extracted includes the pixels within the FOV limits 820 and 830 set for the x and y directions, respectively. Thus, in the depicted example, the subvolume 825 of the image data is smaller than the FOV volume in both the x-dimension and the y-dimension. In some embodiments, the subvolume 825 may extend through all of the slices in the image data, and thus may extend all the way to the edge of the FOV volume in the z-direction. In other embodiments, the subvolume 825 may be defined as including data in a subset of the slices in the image data, such as eliminating the image data in the first portion (or region) of slices and/or the last portion (or region) of slices.

In one embodiment, the system may be configured to identify and extract at least a minimum size subvolume, which is a fixed minimum size stored in memory of the control system, and may be configured to assess the image data within the one or more edge regions outside of the minimum subvolume in the x, y, and/or z-dimensions to eliminate pixels with erroneously high signal intensities from the subvolume. The subvolume may be defined in various ways, such as according to a percentage of the FOV volume in each of the x, y, and z directions or according to a measurement (e.g., in centimeters or other length unit in each direction). The subvolume may be defined with respect to a center point 808 of the image, or may be defined with respect to another point on the image, such as with respect to one or more edges or corners of the FOV volume of the image data. In various embodiments, the image processing algorithm and system may be configured such that the subvolume is always defined as being centered around the center point 808 of the FOV volume (or at least the center of the area in the x/y plane). Alternatively, the processing algorithm and system may be configured such that it can identify a subvolume that is asymmetrical with respect to the center point 808, such as in the event that errant pixels are concentrated on one side of the image and not on the other (e.g., high intensity pixels are located in the first edge region 807*a* and few high intensity pixels appear in edge region 807*b*).

The linear phase error is then estimated at step 708 based on the image data in the subvolume. In one embodiment, the linear phase error may be estimated by determining the mean of the pixel phase error, as is variously described above. In other embodiments, existing methods of error estimating may be used to calculate the linear phase error estimate based on the subvolume, such as the modified Ahn-Cho method.

The linear phase error estimate is then used to phase correct the MR image data at step 710. Namely, the linear phase error is removed from the image data corresponding to the second echo. The water-fat separation calculations are then performed at step 712 with the corrected MR image data, such as according to one of the known separation techniques referenced above to produce an image of the subject depicting a desired amount of signal contribution from water and a desired amount of signal contribution from fat using the separated signal contributions.

In various embodiments, any suitable computer readable media can be used for storing instructions executable by one or more processing devices for performing functions and/or processes described herein as being performed by the one or more controllers. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

This written description uses examples to disclose the invention(s), including the best mode, and also to enable any person skilled in the art to make and use the invention(s). Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention(s) is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. A method for generating an image of a subject with a magnetic resonance imaging (MRI) system, the method comprising:

receiving MR image data acquired with the MRI system, wherein the MR image data comprises first gradient echo data and second gradient echo data;

determining a linear phase error estimate, wherein determining the linear phase error estimate includes:

calculating a pixel phase error for each of a plurality of pixels within the MR image data;

determining a mean of the pixel phase error, wherein the linear phase error estimate is based on the mean of the pixel phase error;

adjusting the second gradient echo data based on the linear phase error estimate to generate corrected MR image data; and generating a water image and/or a fat image based on the corrected MR image data.

2. The method of claim 1, wherein determining the mean of the pixel phase error includes generating a histogram of the pixel phase error and fitting the histogram to a Gaussian function.

3. The method of claim 2, wherein determining the mean of the pixel phase error further includes weighing the histogram of the pixel phase error based on a signal intensity for each of the plurality of pixels prior to fitting the histogram.

4. The method of claim 1, further comprising weighting the pixel phase error for each pixel based on a signal intensity of that pixel to generate a weighted pixel phase error for each of the plurality of pixels, wherein the mean of the pixel phase error is determined based on the weighted pixel phase error.

5. The method of claim 1, wherein the plurality of pixels includes all pixels in the MR image data.

6. The method of claim 1, wherein the MR image data has a field of view (FOV) volume, wherein the plurality of pixels are within a subvolume of the FOV volume.

7. The method of claim 6, wherein the subvolume is smaller than the FOV in at least one of an x-dimension, a y-dimension, and a z-dimension.

8. The method of claim 7, wherein the subvolume is smaller than the FOV in at least the x-dimension and the y-dimension.

9. The method of claim 6, wherein the subvolume is a predetermined fixed volume around a center point of the FOV.

10. The method of claim 6, prior to calculating the pixel phase error for each of the plurality of pixels, identifying the subvolume of the FOV volume based on a signal intensity of one or more pixels within the MR image data.

11. The method of claim 10, wherein the one or more pixels within the MR image data are within an edge region of the FOV volume.

12. A magnetic resonance imaging (MRI) system comprising:

a magnet system configured to generate a polarizing magnetic field about at least a portion of a subject arranged in the MRI system;

a plurality of gradient coils configured to apply gradient pulses to the polarizing magnetic field;

a radio frequency (RF) system configured to apply an RF field to the subject and to acquire magnetic resonance (MR) image data therefrom;

a processing device; and a memory storage device comprising instructions executable by the processing device to:

control the MRI system to acquire MR image data from the subject using generated by the gradient pulses, wherein the MR image data comprises first gradient echo data and second gradient echo data;

calculate a pixel phase error for each of a plurality of pixels within the MR image data;

determine a linear phase error estimate based on the pixel phase errors for the plurality of pixels, wherein determining the linear phase error estimate includes determining a mean of the pixel phase error;

adjust the second gradient echo data based on the linear phase error estimate to generate corrected MR image data; and generate a water image and/or a fat image based on the corrected MR image data.

13. The system of claim 12, wherein the instructions executable by the processing device are configured to determine the mean of the pixel phase error by generating a histogram of the pixel phase error and then fitting the histogram to a gaussian function.

14. The system of claim 13, wherein the instructions executable by the processing device are further configured to determine the mean of the pixel phase error by weighing the histogram of the pixel phase error based on a signal intensity for each of the plurality of pixels prior to fitting the histogram.

15. The system of claim 12, wherein the instructions executable by the processing device are further configured to weight the pixel phase error for each pixel based on a signal intensity of that pixel to generate a weighted pixel phase error for each of the plurality of pixels, wherein the mean of the pixel phase error is determined based on the weighted pixel phase error.

16. The system of claim 12, wherein the plurality of pixels includes all pixels in the MR image data.

17. The system of claim 12, wherein the MR image data has a field of view (FOV) volume, wherein the plurality of pixels are within a subvolume of the FOV volume.

18. The system of claim 17, wherein the subvolume is smaller than the FOV in at least one of an x-dimension, a y-dimension, and a z-dimension.

19. The system of claim 17, wherein the subvolume is a predetermined volume around a center point of the FOV.

20. The system of claim 17, prior to calculating the pixel phase error for each of the plurality of pixels, identifying the subvolume of the FOV volume based on a signal intensity of one or more pixels within an edge region of the FOV volume.

* * * * *